(12) United States Patent
Chang et al.

(10) Patent No.: US 8,293,345 B1
(45) Date of Patent: Oct. 23, 2012

(54) DEVICE HOUSING AND METHOD FOR MAKING THE SAME

(75) Inventors: Hsin-Pei Chang, New Taipei (TW); Wen-Rong Chen, New Taipei (TW); Huann-Wu Chiang, New Taipei (TW); Cheng-Shi Chen, New Taipei (TW); Nan Ma, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/215,682

(22) Filed: Aug. 23, 2011

(30) Foreign Application Priority Data

Mar. 31, 2011 (CN) .......................... 2011 1 0081194

(51) Int. Cl.
*B29D 22/00* (2006.01)
*B32B 19/04* (2006.01)
*B32B 15/04* (2006.01)
*B32B 15/00* (2006.01)
*C23C 14/00* (2006.01)

(52) U.S. Cl. ....... 428/34.6; 428/698; 428/469; 428/640; 204/192.1; 204/192.15

(58) Field of Classification Search ................. 428/34.1, 428/34.4, 34.6, 216, 221, 304.4, 312.2, 318.4, 428/319.1, 336, 469, 472, 640, 698, 701, 428/702; 204/192.1, 192.15
See application file for complete search history.

(56) References Cited

U.S. PATENT DOCUMENTS

2006/0029831 A1* 2/2006 Lindholm et al. ............ 428/698
2006/0269704 A1* 11/2006 Chen .......................... 428/34.4

OTHER PUBLICATIONS

Development and Tool Life Behavior of Super-Wear-Resistant Multilayer Coatings on Hardmetals. Dreyer, K.; Kolaska, J.; Conference Title: Towards Improved Performance of Tool Materials. Conference Location: Teddington, England; E.I. Conference No. 1184 1982, (112-117) Publication Date: Jan. 1, 1982 Publisher: Met Soc (Book 278).*
STIC search.*

* cited by examiner

*Primary Examiner* — Rena Dye
*Assistant Examiner* — Susan R Dye
(74) *Attorney, Agent, or Firm* — Altis Law Group, Inc.

(57) ABSTRACT

A device housing is described. The device housing includes an aluminum alloy substrate and a compound corrosion resistant layer formed on the substrate. The compound corrosion resistant layer includes two crystalline films and a non-crystalline film formed between the crystalline films. One of the crystalline films is formed on the substrate. The crystalline film is a chromium-oxygen-nitrogen film or an aluminum-oxygen-nitrogen film. The non-crystalline film is an aluminum oxide film or a silicon dioxide film. A method for making the device housing is also described.

15 Claims, 2 Drawing Sheets

DEVICE HOUSING AND METHOD FOR MAKING THE SAME

BACKGROUND

1. Technical Field

The present disclosure relates to device housings, particularly to a device housing having a corrosion resistance property and a method for making the device housing.

2. Description of Related Art

Aluminum alloy is widely used for its excellent properties. To protect the aluminum alloy from corrosion, protective layers may be formed on the aluminum alloy by anodizing, painting, or vacuum depositing. However, the anodizing and painting processes are not environmentally friendly, and protective layers formed by vacuum depositing may have pinholes and cracks formed therein. These pinholes and cracks allow corrosives to permeate the layers, which causes a galvanic corrosion to the layers and the underlying aluminum alloy.

Therefore, there is room for improvement within the art.

BRIEF DESCRIPTION OF THE FIGURES

Many aspects of the disclosure can be better understood with reference to the following figures. The components in the figures are not necessarily drawn to scale, the emphasis instead being placed upon clearly illustrating the principles of the disclosure. Moreover, in the drawings like reference numerals designate corresponding parts throughout the several views.

DETAILED DESCRIPTION

Figure 1:
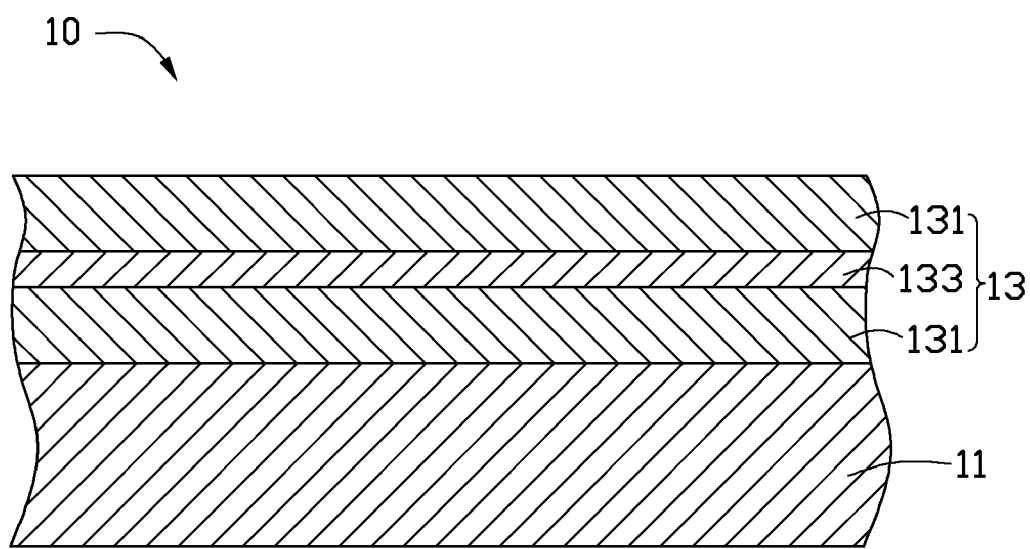
FIG. 1 is a cross-sectional view of an exemplary embodiment of a device housing.

FIG. 1 shows a device housing 10 according to an exemplary embodiment. The device housing 10 includes an aluminum alloy substrate 11, and a compound corrosion resistant layer 13 formed on a surface of the substrate 11.

The compound corrosion resistant layer 13 includes two crystalline films 131 and a non-crystalline film 133 formed between the two crystalline films 131. One of the crystalline films 131 is directly formed on the substrate 11.

Each crystalline film 131 may be a chromium-oxygen-nitrogen (Cr—O—N) film or an aluminum-oxygen-nitrogen (Al—O—N) film in which columnar crystals having a plurality of inter-crystal pores (not shown) are formed. The crystalline film 131 contains Cr—O and Cr—N crystalline phases, or Al—O and Al—N crystalline phases. Each phase inhibits the growth of the other phase, so the size of the crystalline grains in the crystalline film 13 is reduced and the density of the crystalline film 131 is enhanced, which enables the device housing 10 to have a good corrosion resistance property. Each crystalline film 131 has a thickness of about 300 nm-800 nm.

The non-crystalline film 133 may be an aluminum oxide ($Al_2O_3$) film or a silicon dioxide ($SiO_2$) film. The non-crystalline film 133 has a thickness of about 300 μm-500 μm. The non-crystalline film 133 has an internal disorder structure. The non-crystalline film 133 is also a hard coating, which has a high hardness.

As mentioned above, the non-crystalline film 133 having an internal disorder structure obstructs the inter-crystal pores of the two crystalline films 131 from connection. This prevents corrosives from permeating the films 131 and 133 and affecting the substrate 11, thus reducing the corrosion in the device housing 10 and achieves an excellent corrosion resistance property.

The crystalline films 131 and the non-crystalline film 133 may be all formed by vacuum deposition, such as vacuum sputtering or evaporation deposition.

A method for making the device housing 10 may include the following steps:

The substrate 11 is pre-treated. The pre-treating process may include the following steps:

The substrate 11 is cleaned in an ultrasonic cleaning device (not shown) filled with ethanol or acetone.

Figure 2:
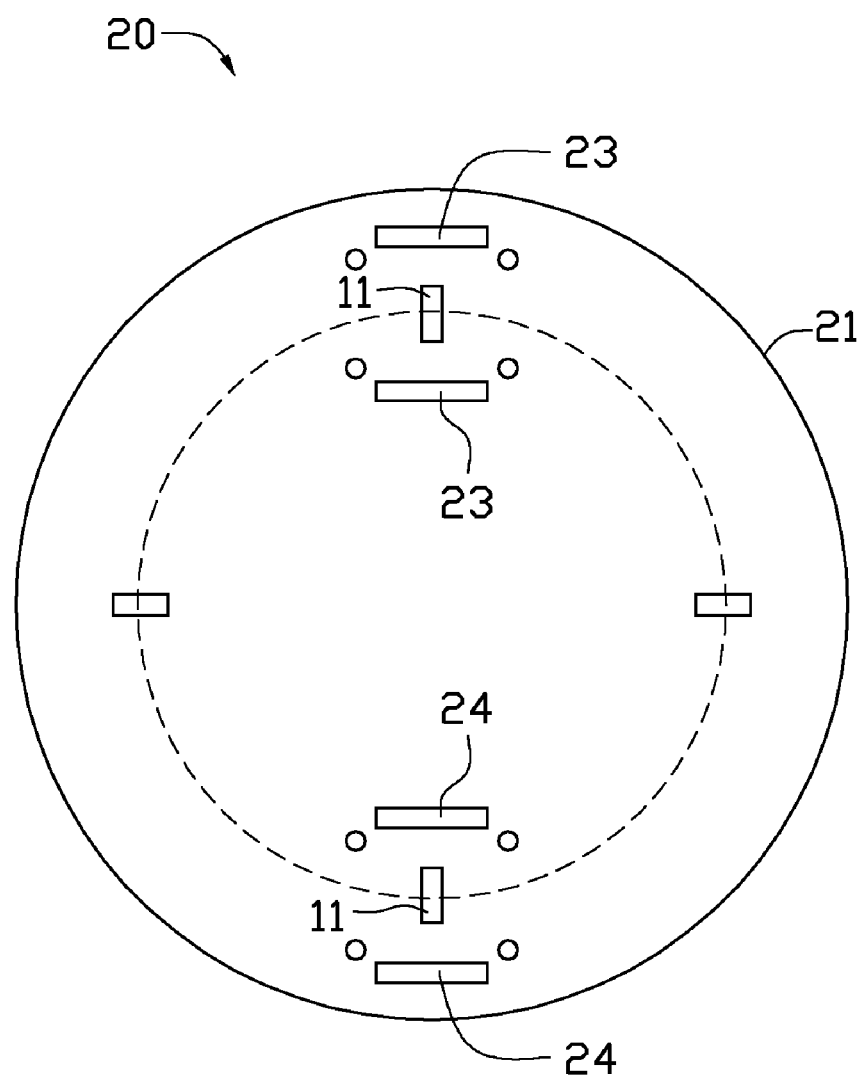
FIG. 2 is an overhead view of an exemplary embodiment of a vacuum sputtering device.

The substrate 11 is plasma cleaned. Referring to FIG. 2, the substrate 11 may be positioned in a coating chamber 21 of a vacuum sputtering device 20. The coating chamber 21 is fixed with first targets 23 and second targets 24 therein. The first targets 23 are made of chromium or aluminum, the second targets 24 are made of silicon or aluminum. The coating chamber 21 is then evacuated to about $8.0 \times 10^{-3}$ Pa. Argon (Ar) gas having a purity of about 99.999% may be used as a working gas and is fed into the coating chamber 21 at a flow rate of about 500 standard-state cubic centimeters per minute (sccm). The substrate 11 may have a bias voltage of about −500 V to about −800 V, then high-frequency voltage is produced in the coating chamber 21 and the argon gas is ionized to plasma. The plasma then strikes the surface of the substrate 11 to clean the surface of the substrate 11. Plasma cleaning the substrate 11 may take about 5 minutes (min) to about 10 min. The plasma cleaning process enhances the bond between the substrate 11 and the compound corrosion resistant layer 13. The first targets 23 and the second targets 24 are unaffected by the pre-cleaning process.

One of the crystalline films 131 may be magnetron sputtered on the pretreated substrate 11 by using the first targets 23. Magnetron sputtering of the crystalline film 131 is implemented in the coating chamber 21. The internal temperature of the coating chamber 21 may be heated to about 100° C.-150° C. Nitrogen ($N_2$) and oxygen ($O_2$) may be used as reaction gases and are fed into the coating chamber 21 at a flow rate of about 20 sccm-40 sccm and about 40 sccm-60 sccm respectively. Argon gas may be used as a working gas and is fed into the coating chamber 21 at a flow rate of about 130 sccm-200 sccm. The ratio of partial pressure of the nitrogen may be about 5%-20% with regards to the total gases in the coating chamber 21, the ratio of partial pressure of the oxygen may be about 15%-40% with regards to the total gases in the coating chamber 21. A power of about 5 kilowatt (KW)-8 KW is applied on the first targets 23, and then aluminum atoms or chromium atoms are sputtered off from the first targets 23. The aluminum or chromium atoms, nitrogen atoms, and oxygen atoms are then ionized in an electrical field in the coating chamber 21. The ionized aluminum or chromium chemically reacts with the ionized nitrogen and oxygen and deposits on the substrate 11 to form the crystalline film 131. During the depositing process, the substrate 11 may have a bias voltage of about −100 V to about −200 V. Depositing of the crystalline film 131 may take about 30 min-150 min.

The non-crystalline film 133 may be magnetron sputtered on the crystalline film 131 by using the second targets 24. Magnetron sputtering of the non-crystalline film 133 is implemented in the coating chamber 21. The internal temperature of the coating chamber 21 may be maintained at about 100° C.-150° C. Oxygen ($O_2$) may be used as a reaction gas and is fed into the coating chamber 21 at a flow rate of about 50 sccm-150 sccm. Argon gas may be used as a working gas and is fed into the coating chamber 21 at a flow rate of about 130 sccm-200 sccm. The ratio of partial pressure of the oxygen may be about 30%-90% with regards to the total gases in the coating chamber 21. A power of about 6 KW-8 KW is applied on the second targets 24, and then silicon atoms or aluminum atoms are sputtered off from the second targets 24. The silicon or aluminum atoms and oxygen atoms are then ionized in an electrical field in the coating chamber 21. The ionized silicon or aluminum chemically reacts with the ionized oxygen and deposits on the crystalline film 131 to form the non-crystalline film 133. During the depositing process, the substrate 11 may have a bias voltage of about −100 V to about −200 V. Depositing of the non-crystalline film 133 may take about 20 min-70 min.

The step of magnetron sputtering the crystalline film 131 is repeated to form the other crystalline film 131 on the non-crystalline film 133 and forms the compound corrosion resistant layer 13.

Specific examples of making the device housing 10 are described below. The ultrasonic cleaning in these specific examples may be substantially the same as described above so it is not described here again. Additionally, the process of magnetron sputtering the compound corrosion resistant layer 13 in the specific examples is substantially the same as described above, and the specific examples mainly emphasize the different process parameters of making the device housing 10.

EXAMPLE 1

The substrate 11 is made of 6061 or 6063 aluminum alloy.

Plasma cleaning the substrate 11: the flow rate of argon gas is 500 sccm; the substrate 11 has a bias voltage of −500 V; plasma cleaning of the substrate 11 takes 8 min.

Sputtering to form a crystalline film 131 on the substrate 11: the flow rate of argon gas is 180 sccm, the flow rate of nitrogen is 20 sccm, the flow rate of oxygen is 40 sccm; the ratio of partial pressure of nitrogen is 7%, the ratio of partial pressure of oxygen is 17%; the substrate 11 has a bias voltage of −170 V; the first targets 23 are made of chromium and are applied with a power of 6 KW; the internal temperature of the coating chamber 21 is 120° C.; sputtering of the crystalline film 131 takes 60 min; the crystalline film 131 has a thickness of 500 nm.

Sputtering to form non-crystalline film 133 on the crystalline film 131: the flow rate of argon gas is 180 sccm, the flow rate of oxygen is 80 sccm; the ratio of partial pressure of oxygen is 30%; the substrate 11 has a bias voltage of −150 V; the second targets 24 are made of silicon and are applied with a power of 6 KW; the internal temperature of the coating chamber 21 is 120° C.; sputtering of the non-crystalline film 133 takes 70 min; the non-crystalline film 133 has a thickness of 400 nm.

Repeats the step of sputtering the crystalline film 131 to form another crystalline film 131 on the non-crystalline film 133.

EXAMPLE 2

The substrate 11 is made of 5052 aluminum alloy.

Plasma cleaning the substrate 11: the flow rate of argon gas is 500 sccm; the substrate 11 has a bias voltage of −600 V; plasma cleaning of the substrate 11 takes 5 min.

Sputtering to form a crystalline film 131 on the substrate 11: the flow rate of argon gas is 150 sccm, the flow rate of nitrogen is 30 sccm, the flow rate of oxygen is 60 sccm; the ratio of partial pressure of nitrogen is 12.5%, the ratio of partial pressure of oxygen is 25%; the substrate 11 has a bias voltage of −200 V; the first targets 23 are made of aluminum and are applied with a power of 8 KW; the internal temperature of the coating chamber 21 is 150° C.; sputtering of the crystalline film 131 takes 90 min; the crystalline film 131 has a thickness of 300 nm.

Sputtering to form non-crystalline film 133 on the crystalline film 131: the flow rate of argon gas is 150 sccm, the flow rate of oxygen is 100 sccm; the ratio of partial pressure of oxygen is 40%; the substrate 11 has a bias voltage of −150 V; the second targets 24 are made of silicon and are applied with a power of 8 KW; the internal temperature of the coating chamber 21 is 150° C.; sputtering of the non-crystalline film 133 takes 60 min; the non-crystalline film 133 has a thickness of 350 nm.

Repeats the step of sputtering the crystalline film 131 to form another crystalline film 131 on the non-crystalline film 133.

A salt spray test has been performed on the device housings 10 described in the above examples 1-2. The salt spray test used a sodium chloride (NaCl) solution having a mass concentration of 5% at a temperature of 35° C. The test indicated that the corrosion resistance property of the device housing 10 lasted longer than 96 hours. Thus, the device housing 10 has an excellent corrosion resistance property.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A device housing, comprising:
   an aluminum alloy substrate; and
   a compound corrosion resistant layer formed on the substrate, the compound corrosion resistant layer comprising two crystalline films and a non-crystalline film formed between the crystalline films, one of the crystalline films being formed on the substrate; the crystalline film being a chromium-oxygen-nitrogen film or an aluminum-oxygen-nitrogen film, the non-crystalline film being an aluminum oxide film or a silicon dioxide film.

2. The device housing as claimed in claim 1, wherein each crystalline film has a thickness of about 300 nm-800 nm.

3. The device housing as claimed in claim 1, wherein the non-crystalline film has a thickness of about 300 nm-600 nm.

4. The device housing as claimed in claim 1, wherein the crystalline films contain columnar crystals having a plurality of inter-crystal pores.

5. The device housing as claimed in claim 1, wherein the chromium-oxygen-nitrogen or aluminum-oxygen-nitrogen crystalline films contain Cr—O and Cr—N crystalline phases, or Al—O and Al—N crystalline phases, respectively.

6. The device housing as claimed in claim 1, wherein the non-crystalline film has an internal disorder structure.

7. A method for making a device housing, comprising:
   providing an aluminum alloy substrate; and
   forming a compound corrosion resistant layer on the substrate by vacuum sputtering, the compound corrosion resistant layer comprising two crystalline films and a non-crystalline film formed between the crystalline films, one of the crystalline films being formed on the substrate;
   the crystalline film being a chromium-oxygen-nitrogen film or an aluminum-oxygen-nitrogen film, the non-crystalline film being an aluminum oxide film or a silicon dioxide film.

8. The method as claimed in claim 7, wherein forming the compound corrosion resistant layer comprises vacuum sputtering one of the crystalline films on the substrate, vacuum sputtering the non-crystalline film on the crystalline film, and vacuum sputtering the other crystalline film on the non-crystalline film.

9. The method as claimed in claim 8, wherein vacuum sputtering the crystalline films uses a magnetron sputtering process, uses nitrogen and oxygen as reaction gases, the nitrogen and oxygen have a flow rate of about 20 sccm-40 sccm and 40 sccm-60 sccm respectively; uses argon as a working gas, the argon has a flow rate of about 130 sccm-200 sccm; ratios of partial pressure of the nitrogen and the oxygen are about 5%-20% and about 15%-40% with regard to a total of the nitrogen, oxygen, and argon; uses a target made of aluminum or chromium, the target is applied with a power of about 5 KW-8 KW; magnetron sputtering of the crystalline film is conducted at a temperature of about 100° C.-150° C. and takes about 30 min-150 min.

10. The method as claimed in claim 9, wherein the substrate has a bias voltage of about −100V to about −200V during sputtering of the crystalline film.

11. The method as claimed in claim 8, wherein vacuum sputtering the non-crystalline film uses a magnetron sputtering process, uses oxygen as a reaction gas, the oxygen has a flow rate of about 50 sccm-150 sccm; uses argon as a working gas, the argon has a flow rate of about 130 sccm-200 sccm; ratio of partial pressure of the oxygen is about 30%-90% with regards to a total of the oxygen and argon; uses a target made of silicon or aluminum, the target is applied with a power of about 6 KW-8 KW; magnetron sputtering of the non-crystalline film is conducted at a temperature of about 100° C.-150° C. and takes about 20 min-70 min.

12. The method as claimed in claim 11, wherein the substrate has a bias voltage of about −100V to about −200V during sputtering of the non-crystalline film.

13. The method as claimed in claim 7, further comprising a step of pre-treating the substrate before forming the compound corrosion resistant layer.

14. The method as claimed in claim 13, wherein the pre-treating process comprises ultrasonic cleaning the substrate and plasma cleaning the substrate.

15. The method as claimed in claim 14, wherein plasma cleaning of the substrate uses argon as a working gas, the argon has a flow rate of about 500 sccm; the substrate has a bias voltage of about −500 V to about −800 V; plasma cleaning of the substrate takes about 5 min-10 min.

\* \* \* \* \*